(12) United States Patent
Jang et al.

(10) Patent No.: US 7,042,003 B2
(45) Date of Patent: May 9, 2006

(54) LIGHT RECEIVING ELEMENT USING INTERCONNECTED NANOPARTICLES

(75) Inventors: Eun Joo Jang, Gyeonggi-Do (KR); Sang Sig Kim, Seoul (KR); Kyoung Ah Cho, Seoul (KR); Hyun Suk Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 71 days.

(21) Appl. No.: 10/741,441

(22) Filed: Dec. 22, 2003

(65) Prior Publication Data
US 2004/0129932 A1    Jul. 8, 2004

(30) Foreign Application Priority Data
Dec. 23, 2002    (KR) .................... 10-2002-0082529

(51) Int. Cl.
*H01L 29/221* (2006.01)
*H01L 31/0296* (2006.01)

(52) U.S. Cl. ........................................ 257/21; 257/188
(58) Field of Classification Search .................. 257/21, 257/188
See application file for complete search history.

(56) References Cited

U.S. PATENT DOCUMENTS

| | | | |
|---|---|---|---|
| 4,625,071 A | * | 11/1986 | Delahoy et al. ............ 136/250 |
| 6,744,065 B1 | * | 6/2004 | Samuelson et al. ........... 257/14 |
| 6,861,155 B1 | * | 3/2005 | Bawendi et al. ............ 428/549 |
| 6,861,722 B1 | * | 3/2005 | Graetzel et al. ............ 257/461 |
| 2004/0129932 A1 | * | 7/2004 | Jang et al. .................... 257/21 |
| 2005/0064618 A1 | * | 3/2005 | Brown et al. ................. 438/49 |

* cited by examiner

*Primary Examiner*—Jerome Jackson
(74) *Attorney, Agent, or Firm*—Buchanan Ingersoll PC

(57) ABSTRACT

A light receiving element, in which nanoparticles obtained by a colloidal synthesis are interconnected so as to serve as a channel for electrons excited by light received by the nanoparticles, thereby improving the performance of the light receiving element and simplifying a process for manufacturing the light receiving element.

7 Claims, 4 Drawing Sheets

LIGHT RECEIVING ELEMENT USING INTERCONNECTED NANOPARTICLES

BACKGROUND OF THE INVENTION

This non-provisional application claims priority under 35 U.S.C. § 119(a) to Korean Patent Application No. 2002-82529, which was filed in Korea on Dec. 23, 2002, and which is incorporated herein by reference.

1. Field of the Invention

The present invention relates to a light receiving element using interconnected nanoparticles, and, more particularly, to a light receiving element comprising two electrodes positioned opposite to each other and a light receiving portion interposed between the two electrodes, the light receiving portion comprising interconnected nanoparticles obtained by a colloidal synthesis method.

2. Description of the Related Art

A well known conventional light receiving element using a quantum effect generally adapts a quantum well (hereinafter, referred to as "QW") structure as shown in FIG. 1. When light is irradiated onto the light receiving element in a perpendicular direction (direction "a") of the QW, quantum efficiency deteriorates because optical pumping occurs due to the influence of an electric field formed in a direction perpendicular to the light irradiation direction. On the other hand, when light is irradiated onto the light receiving element in a parallel direction (direction "b") of the QW, optical pumping occurs due to the quantum efficiency but it is difficult to converge light onto the QW, which has a very small area on the order of several of nanometers(nm), thereby adversely effecting light receiving efficiency. Also, as shown in FIG. 2, a generated photo current flows sequentially along a quantum well (QW), a quantum barrier (QB) and then the other quantum well (QW), thus reducing efficiency of the light receiving element. For maximum efficiency, the light receiving element should be thicker than the wavelength of the light being sensed. As a result, for infrared light, several hundred layers of the QW may be needed for forming the light receiving element. The growth of these layers may take a long time and requires expensive apparatus, such as a molecular beam epitaxy (MBE) apparatus.

In a recently proposed light receiving element using quantum dots, the quantum dots are self-assembled by a vapor deposition method such as MOCVD or MBE. The structure of the light receiving element using the quantum dots synthesized by the vapor deposition method is configured such that the self-assembled quantum dots are inserted into an quantum well active layer of a p-n junction structure of the conventional QW light receiving element. However, this light receiving element using quantum dots has the following problems:

1) The synthesized quantum dots are not interconnected and are independently arranged. Accordingly, even though the received light excites electrons, it is difficult to generate effective photo current due to a quantum barrier.

2) After a monolayer of the self-assembled quantum dots is formed by the vapor deposition method such as MOCVD or MBE, a barrier layer is necessarily formed thereon. For this reason, the light receiving portion is too thin compared to the wavelength of visible or infrared light. When the light receiving portion is thinner than the wavelength of visible or infrared light, light may transit the portion. Accordingly, the light absorption efficiency of the light receiving element is adversely effected. In particular, the light receiving element for infrared light requires an active layer having a thickness of several micrometers. However, it is difficult to attain this thickness with quantum dots prepared by MOCVD or MBE.

3) Because the light receiving element using the quantum dots has a p-n junction structure, a process for manufacturing the light receiving element is complicated and light receiving window efficiency is not good.

SUMMARY OF THE DISCLOSURE

It is a feature of the disclosed embodiments to provide a light receiving element manufactured by interconnecting nanoparticles, exhibiting an isotropic quantum effect.

In accordance with certain aspects of the present invention, there is provided a light receiving element comprising two electrodes positioned opposite to each other and a light receiving portion interposed between the two electrodes, the light receiving portion comprising interconnected nanoparticles obtained by a wet colloidal synthesis method.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PRESENT INVENTION

The present invention will be described in detail with reference to the annexed drawings.

An optical element using nanoparticles obtained by a wet colloidal synthesis method has been realized. An optical element using nanoparticles may be utilized in a light receiving element, and the element will have higher efficiency than a conventional light receiving element using a planar QW structure, which may not absorb light having an electric field in a direction parallel to the planar QW. Therefore, in view of the above aspect, the present invention proposes a light receiving element using the isotropic quantum effect of nanoparticles.

Figure 1:
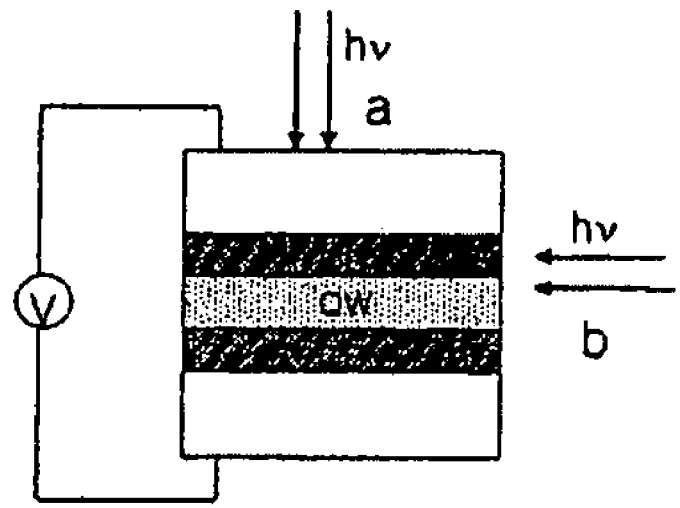
FIG. 1 is a schematic cross-sectional view of a conventional light receiving element utilizing quantum effect.
Figure 2:
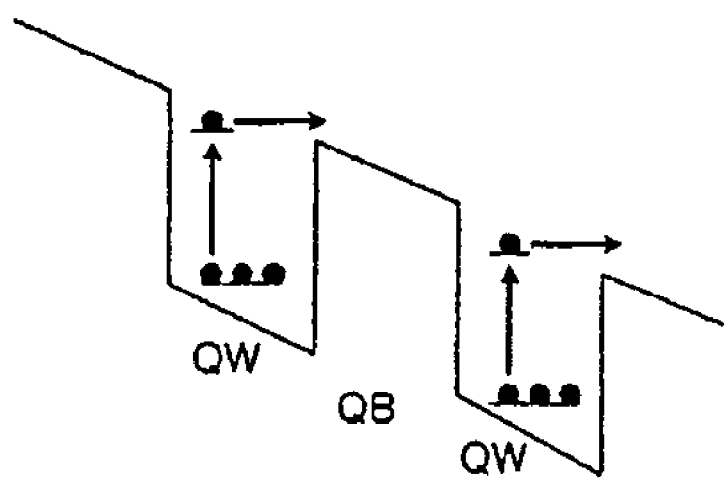
FIG. 2 is a schematic view illustrating an operating principle of the conventional light receiving element utilizing quantum effect.
Figure 3:
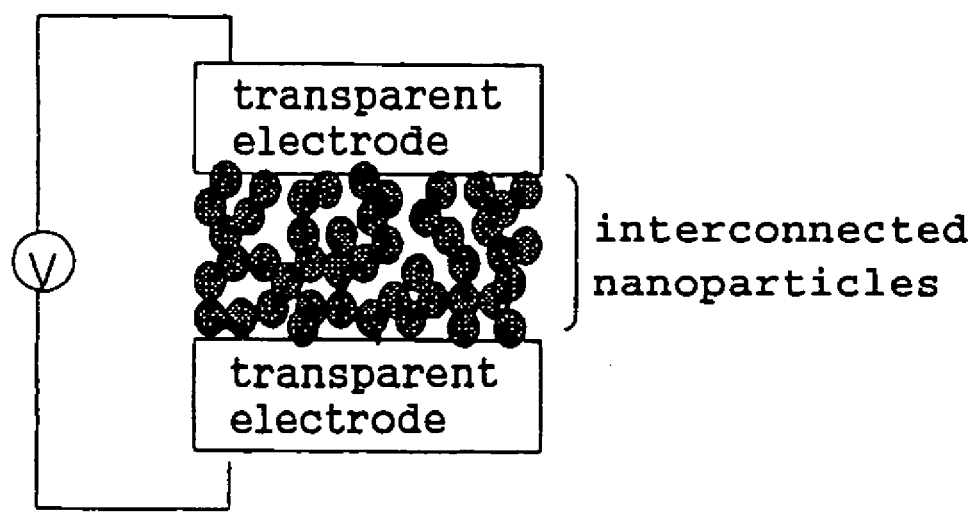
FIG. 3 is a schematic cross-sectional view of a light receiving element in accordance with the present invention.
Figure 4:
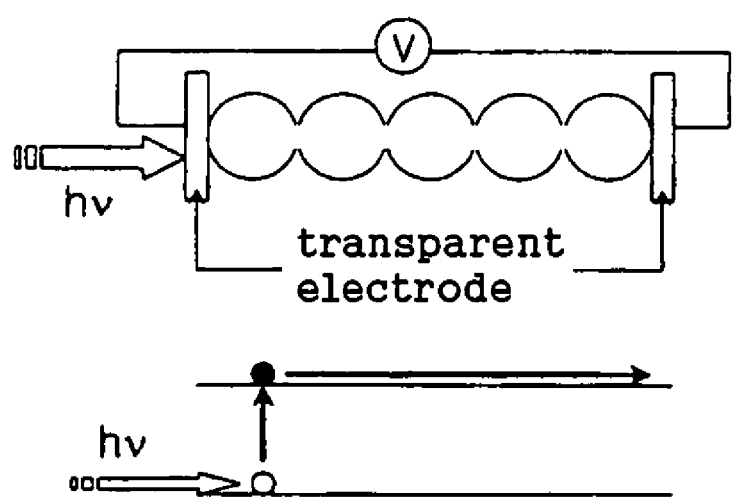
FIG. 4 is a schematic view illustrating an operating principle of the light receiving element in accordance with the present invention.

FIG. 3 is a schematic cross-sectional view of a light receiving element and FIG. 4 is a schematic view illustrating the operating principle of the light receiving element in accordance with the present invention. When light is irradiated on electrons in the valance band of interconnected nanoparticles, the electrons are excited to the conduction band, and a current flows through a channel formed by the interconnected nanoparticles.

Figure 5:
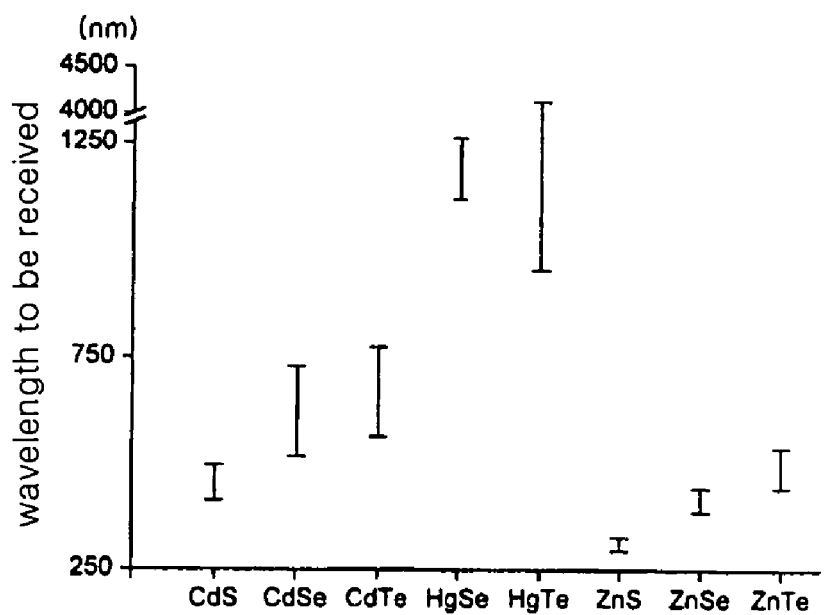
FIG. 5 is a graph illustrating which wavelengths of light can be received by light receiving elements made of various materials.

In the present invention, semiconductor nanoparticles are used which are made of a material selected from the group consisting of II-VI group compound semiconductor materials such as HgTe, HgSe, HgS, CdTe, CdSe, CdS, ZnTe, ZnSe and ZnS, and IV-VI group compound semiconductor materials such as PbTe, PbSe and PbS. The selection of a suitable semiconductor material is an important factor in manufacturing a variable infrared optical element. FIG. 5 is a graph illustrating wavelengths which can be received by light receiving elements made of various materials.

HgTe is specially focused on for the production of nanoparticles because HgTe has an energy gap of approximately 0 eV in a bulk state. When the size is regulated in the range of from 3 nm to 10 nm, the nanoparticles may have an energy gap in the entire infrared wavelength range of from about 0.9 μm to several tens of micrometers.

The nanoparticles used in the present exemplary embodiment are manufactured by a well-known wet colloidal synthesis method. This method has several advantages in that it produces nanoparticles having excellent crystallinity and high surface density. The size and size distribution of the nanoparticles are easily controlled compared to a conventional method such as MBE or MOCVD. Further, production cost is very low and mass production is possible.

When the nanoparticles are manufactured by the wet colloidal synthesis method, selection of capping organic material is a very important factor. The capping material regulates the size of the nanoparticles by preventing the nanoparticles from growing over a certain size, and also serves as a stabilizer by reducing defects on the surfaces of the nanoparticles. Further, the capping material serves to maintain the physical properties of the nanoparticles against time and heat. Examples of a suitable capping material includes, but is not limited to, 1-thioglycerol, ethylene diamine, diglycerol, thioglycollic acid, etc.

Figure 6:
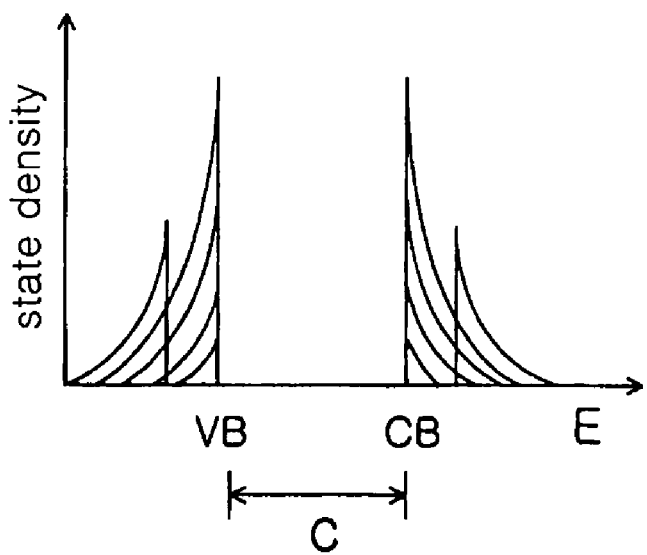
FIG. 6 is a graph illustrating an energy state density according to the size of nanoparticles.

It is possible to manufacture an element that selectively receives light having a designated wavelength in an entire region of infrared wavelengths by regulating the size of the nanoparticles. FIG. 6 is a graph illustrating the energy state density for various sizes of nanoparticles. As shown in FIG. 6, band gap C is regulated by changing the size of the nanoparticles. Thereby, a light receiving element having high efficiency for receiving a specific, desired wavelength is manufactured. Generally, nanoparticles having a smaller size have a greater band gap C.

Figure 7A:
FIGS. 7a and 7b are schematic views illustrating the structure of nanoparticles used in the present invention.
Figure 7B:

The nanoparticles used in the present invention may be formed in a single structure as shown in FIG. 7a, or in a core-shell structure as shown in FIG. 7b. In the core-shell structure, the core g is made of a QB material, and the shell f is made of a QW material. The QB material and the QW material may be selected from the above-described semiconductor materials. The QB material should have a band gap greater than the QW material, and have a lattice constant, a lattice structure and a chemical composition similar to those of the QW material. For example, when the QW material is made of HgTe, the QB material may be selected from the group consisting of CdTe, ZnTe, CdS, CdSe, and ZnSe. The nanoparticles having the core-shell structure can also be manufactured by the wet colloidal synthesis method.

Figure 8:
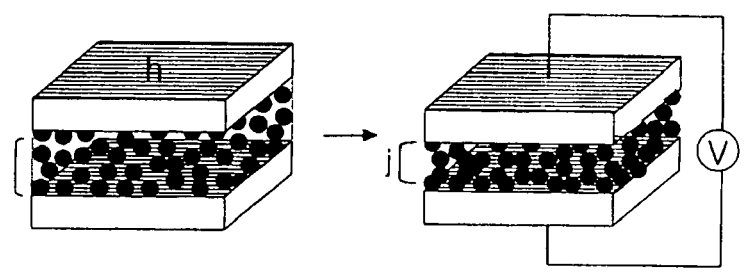
FIG. 8 is a cross-sectional view illustrating a process of manufacturing the light receiving element in accordance with the present invention.

As shown in FIG. 8, the light receiving element of the present exemplary embodiment is manufactured by applying the nanoparticles manufactured by the wet colloidal synthesis method to a gap between two transparent electrodes as shown by structure i and then by interconnecting the nanoparticles to a structure j. When interconnection between the nanoparticles occurs, a channel for current flow is formed.

The interconnection of the nanoparticles is obtained by thermal annealing or laser annealing. A thermal annealing temperature is determined in consideration of the following factors. The melting point of the nanoparticles is lower than that of the bulk material and thus the nanoparticles have excellent sintering activity. Usually, the temperature required to interconnect the nanoparticles corresponds to approximately two-thirds of the melting point of the bulk material. Because II-VI group compound semiconductor bulk material has a melting point of approximately 1,500K, it is expected that a suitable interconnecting temperature of the nanoparticles is approximately 500K. However, the interconnecting temperature of the nanoparticles varies according to the materials and sizes of the nanoparticles. In consideration of the above may be suitable to perform thermal annealing at a temperature, for example, of 400~800K for 1~10 minutes. Thermal annealing has several advantages in that a large quantity of elements can be simultaneously annealed and the entire portion in an element can be annealed under the same conditions. However, thermal annealing has disadvantages in that there are large interfaces among annealed particles, and the surface uniformity of the nanoparticle film decreases during the thermal process.

When laser annealing is used, nanoparticles are applied onto an electrode and is covered by a second electrode to form the light receiving element. Then, a laser beam is irradiated through a light receiving path, thereby increasing the temperature of only the nanoparticles such that the nanoparticles are interconnected. In this case, the electrodes do not absorb the laser beam and are maintained at room temperature. Accordingly, a light receiving element having a comparatively stable structure is easily and simply manufactured. In this method, irradiated laser beam should have a wavelength equal to or shorter than the band gap of the semiconductor nanoparticles. Preferably, the wavelength of the laser beam is in the range of 400 nm to 800 nm, however, the optimum wavelength of the beam will change based on the material and the size of the nanoparticles. Generally, it is suitable to use a 514 nm or 488 nm Ar laser or a 647 nm or 676 nm Kr laser. The annealing is preferably performed at a laser power density of 100~500 mW/(5 mm)$^2$ for 10~30 minutes under an inert gas atmosphere.

The light receiving element according to the present exemplary embodiment has advantages, as follows:

1) It is possible to adjust the wavelength of received light by adjusting the size of the nanoparticles.

2) It is possible to improve light-receiving efficiency due to the discontinuity of the energy state density.

3) It is possible to perform luminescence with high efficiency at room temperature because a bonding energy of excitons is increased.

4) It is possible to efficiently receive light which is isotropic to the entire polarized directions.

5) Nanoparticles synthesized by the wet colloidal synthesis method are interconnected under thin film manufacturing conditions, thus forming an efficient current channel for electrons excited by received light.

6) The nanoparticles are easily stacked on an electrode, thereby forming a light receiving portion having a thickness of several micrometers and increasing light receiving efficiency.

7) It is possible to manufacture a light receiving element without a p-n junction structure, and the simple structure of the light receiving element of the present exemplary embodiments increases window efficiency.

Hereinafter, an example of a method for manufacturing the light receiving element of the present exemplary embodiments will be described in detail. The following example is disclosed for illustrative purposes, but does not limit the present invention.

EXAMPLE 1M of NaOH was added to a solution obtained by mixing 0.94 g (2.35 mmol) of $Hg(ClO_4)_2 \cdot 3H_2O$(Aldrich, 98%) and 0.5 mL (5.77 mmol) of 1-thiolycerol(Aldrich, 95%) with 125 mL of ultra pure water, thereby adjusting the pH of the solution to 11.63. The solution was poured into a three-neck flask, and bubbled for 30 minutes under a nitrogen gas atmosphere. Separately, 0.08 g of $Al_2Te_3$ (Cerac, 99.5%) was reacted with 10 mL of 0.5 M $H_2SO_4$ solution, thereby generating $H_2Te$ gas. The generated $H_2Te$ gas and nitrogen gas were introduced into the obtained solution with the solution stirred. In order to prevent Te from being oxidized, a vacuum condition was applied into the flask.

After the reaction was completed, the solution in a dark brown color was concentrated to approximately 30 mL using a rotary evaporator to remove large quantities of impurities. 2-propanol serving as a precipitating agent was added to the solution until the solution became clouded, and then the solution was stirred for approximately 3 hours. Nanoparticles of HgTe capped with 1-thioglycerol were obtained by centrifugation. The obtained nanoparticles were washed with absolute ethanol and ultra pure water and dried naturally.

The obtained nanoparticles were applied onto an ITO electrode, and then another electrode was arranged thereon so that a light receiving element structure was formed. An Ar laser beam (514 nm) having a laser power density of 100 mW/(5 mm)$^2$ was irradiated onto a nanoparticle layer interposed between the electrodes for 10 minutes under an inert gas atmosphere.

Figure 9:
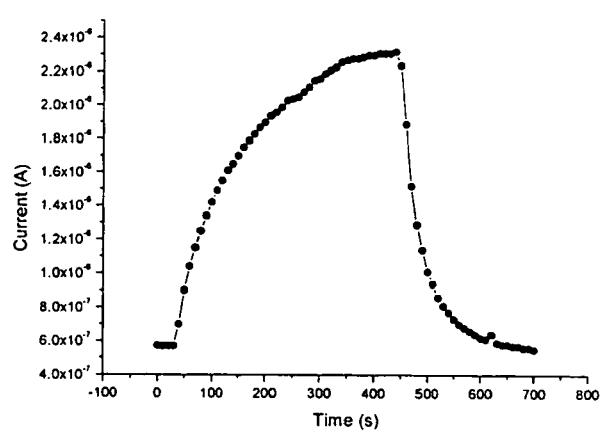
FIG. 9 is a graph illustrating variation of current flow when Ar laser beam is irradiated on the light receiving element prepared in the Example of the present invention.

FIG. 9 is a graph illustrating variation of current flow when Ar laser beam having laser power density of 1 mW/(5 mm)$^2$ is irradiated on the light receiving element for 450 seconds.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A light receiving element comprising:
   two electrodes positioned opposite each other; and
   a light receiving portion interposed between the two electrodes, said light receiving portion comprising interconnected nanoparticles each having a core portion and a shell portion, said core portion of each nanoparticle being composed of a higher band gap material and said shell portion of each nanoparticle being composed of a lower band gap material.

2. The light receiving element as set forth in claim 1, wherein the nanoparticles are made of one semiconductor material selected from the group consisting of a II-VI group compound semiconductor material and a IV-VI group compound semiconductor material.

3. The light receiving element as set forth in claim 1, wherein the nanoparticles are interconnected by thermal annealing or laser annealing.

4. The light receiving element as set forth in claim 3, wherein the thermal annealing is performed at a temperature of 400–800K for 1–10 minutes.

5. The light receiving element as set forth in claim 3, wherein the laser annealing is performed at a wavelength range of 400–800 nm and a laser power density of 100–500 mW/(5 mm)$^2$ for 10–30 minutes.

6. The light receiving element as set forth in claim 2, wherein the II-VI group compound semiconductor material is selected from the group consisting of HgTe, HgSe, HgS, CdTe, CdSe, CdS, ZnTe, ZnSe and ZnS.

7. The light receiving element as set forth in claim 2, wherein the IV-VI group compound semiconductor material is selected from the group consisting of PbTe, PbSe and PbS.

* * * * *